United States Patent
Hsu (10) Patent No.: US 9,177,976 B2
(45) Date of Patent: Nov. 3, 2015

(54) TFT SUBSTRATE AND METHOD OF REPAIRING THE SAME

(71) Applicant: CHUNGHWA PICTURE TUBES, LTD., Padeh, Taoyuan (TW)

(72) Inventor: Han-Tung Hsu, Taoyuan County (TW)

(73) Assignee: CHUNGHWA PICTURE TUBES, LTD., Padeh, Taoyuan (TW)

( * ) Notice: Subject to any disclaimer, the term of this patent is extended or adjusted under 35 U.S.C. 154(b) by 0 days.

(21) Appl. No.: 14/142,562

(22) Filed: Dec. 27, 2013

(65) Prior Publication Data

US 2015/0137129 A1     May 21, 2015

(30) Foreign Application Priority Data

Nov. 15, 2013 (TW) .............................. 102141730 A (51) Int. Cl.
| H01L 29/04 | (2006.01) |
|---|---|
| H01L 27/12 | (2006.01) |
| H01L 21/66 | (2006.01) |
| H01L 29/43 | (2006.01) |

(52) U.S. Cl.
CPC ............ H01L 27/1259 (2013.01); H01L 22/10 (2013.01); H01L 22/20 (2013.01); H01L 27/124 (2013.01); H01L 29/43 (2013.01)

(58) Field of Classification Search
CPC ......... H01L 22/10; H01L 22/20; H01L 29/43; H01L 27/124; H01L 27/1259
See application file for complete search history.

(56) References Cited

U.S. PATENT DOCUMENTS

| 2003/0112383 A1* | 6/2003 | Kim ................................ 349/43 |
| 2012/0161137 A1 | 6/2012 | Lee |
| 2013/0043476 A1* | 2/2013 | Sung et al. ....................... 257/59 |

FOREIGN PATENT DOCUMENTS

| CN | 102468308 A | 5/2012 |
| CN | 102998863 S | 3/2013 |
| CN | 103293804 A | 9/2013 |
| TW | I355735 B | 1/2012 |
| WO | WO2013/031823 A1 | 3/2013 |

* cited by examiner

Primary Examiner — Shaun Campbell
(74) Attorney, Agent, or Firm — Muncy, Geissler, Olds & Lowe, P.C.

(57) ABSTRACT

A thin film transistor (TFT) substrate includes: a substrate; a plurality of scan lines, disposed on the substrate; a plurality of data lines, disposed across the scan lines; a scan line insulting layer disposed between the scan lines and the data lines; a plurality of thin film transistors, each of thin film transistors disposed on an intersection of each scan line and each data line; a data line insulting layer, disposed on a top surface of the scan line insulting layer and used to cover the data lines; and a common electrode, disposed on the data line insulting layer, and comprising a plurality of positioning through holes, wherein the positioning through holes expose the data line insulting layer, and are located right above the data lines.

13 Claims, 6 Drawing Sheets

Fig. 7

TFT SUBSTRATE AND METHOD OF REPAIRING THE SAME

CROSS-REFERENCE TO RELATED APPLICATION

This application claims the benefit of Taiwan Patent Application No. 102141730, filed on Nov. 15, 2013, which is hereby incorporated by reference for all purposes as if fully not forth herein.

BACKGROUND OF THE INVENTION

1. Field of Invention

The present invention is related to a thin film transistor (TFT) substrate and a method of repairing the same, and particularly, to a TFT substrate and a method for repairing a TFT substrate with IPS (In Plane Switching) wide viewing angle technology and a TFT substrate with FFS (Fringe Field Switching) technology.

2. Related Art

Usually, LCD (Liquid crystal display) panels include a TFT substrate, a color filter substrate, and an LC layer sandwiched between the two substrates. With a voltage applied, the liquid crystal molecules therebetween may twist to allow light passing or not so as to display images. However, the twisted nematic mode for controlling liquid crystal molecules is adopted by the conventional LC panels, which has a problem of narrow viewing angle. That is, the images displayed by the LCD panel with the twisted nematic mode have different qualities from different view angles.

Therefore, the technologies of IPS (In Plane Switching) wide viewing angle and FES (Fringe Field Switching) are used to solve the problem of narrow viewing angle for the convention LCD panels. For example, in the FFS technology, the common electrodes (Vcom) formed on a transparent conductive layer is disposed above the pixel electrodes, so that the efficiency of fringe field can be improved, the aperture rate can be increased, and the light leakage can be reduced.

In addition, for sake of stability of the common electrodes, the common electrodes are designed as a net (the top, bottom, left, and right are connected in serial); however, if particles or photo-resists are remained above the data line during the formation process of the data line insulting layer or the common electrode, the common electrode and the data line may have a short circuit problem, which leads to a poor image quality, but the FFS technology has no solution for such a problem.

Therefore, a TFT substrate and a method for repairing the TFT substrate are requested if a short problem is generated in the common electrodes and the date lines.

SUMMARY OF THE INVENTION

Accordingly, the objective of the present invention is to provide a TFT substrate and a method for repairing the same, in which visible defects can be fixed.

To achieve the objective, the present invention provides a thin film transistor (TFT) substrate includes: a substrate; a plurality of scan lines, disposed on the substrate; a plurality of data lines, disposed across the scan lines; a scan line insulting layer disposed between the scan lines and the data lines; a plurality of thin film transistors, each of thin film transistors disposed on an intersection of each scan line and each data line; a data line insulting layer, disposed on a top surface of the scan line insulting layer and used to cover the data lines; and a common electrode, disposed on the data line insulting layer, and comprising a plurality of positioning through holes, wherein the positioning through holes expose the data line insulting layer, and are located right above the data lines.

To achieve the objective, the present invention provides a method of repairing a thin film transistor (TFT) substrate, including the following steps of: providing the above-mentioned TFT substrate; testing the TFT substrate, and finding visible defects; searching for a short circuit position where the common electrode and the data line have a short circuit; and cutting off a part of the common electrode near the short circuit position, wherein the positioning through holes are used as positioning points for cutting off the short circuit position of the common electrode.

Another objective of the present invention is to provide a TFT substrate, which avoids a short circuit between the data line and the common electrode if particles fall above the data line.

To achieve the objective, the present invention provides a thin film transistor (TFT) substrate, including: a substrate; a plurality of scan lines, disposed on the substrate; a plurality of data lines, disposed across the scan lines; a scan line insulting layer disposed between the scan lines and the data lines; a plurality of thin film transistors, each of thin film transistors disposed on an intersection of each scan line and each data line; a data line insulting layer, disposed on a top surface of the scan line insulting layer and used to cover the data lines; a transparent conductive layer is disposed on a top surface of the data line insulting layer; a transparent protective layer, disposed on a top surface of the transparent conductive layer; and a common electrode, disposed on a top surface of the transparent protective layer.

The TFT substrate of the present invention can be applied to the panels adopted the IPS (In Plane Switching) wide viewing angle technology and the panel adopted the FFS (Fringe Field Switching) technology. In the TFT substrate of the present invention, positioning through holes are used as positioning points for cutting off the short circuit position of the common electrode, and the top and bottom portions of the part of the common electrode where is near the short circuit position is cut off (for example, the top and bottom portions of the part of the common electrode can be cut off form the positioning through holes to the bar-shaped through holes), such that the part of the common electrode and the other part of the common electrode are electrically insulated from each other, so as to repair the defect part. Alternatively, a transparent conductive layer and a transparent protective layer are used as a buffer layer to avoid a short circuit between the data line and the common electrode if particles fall above the data line.

The present invention will become more fully understood from the detailed description given herein below for illustration only, which thus is not limitative of the present invention.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

To make the present invention more comprehensible, the present invention is described in detail in the following with reference to the embodiments and accompanying drawings.

Figure 1:
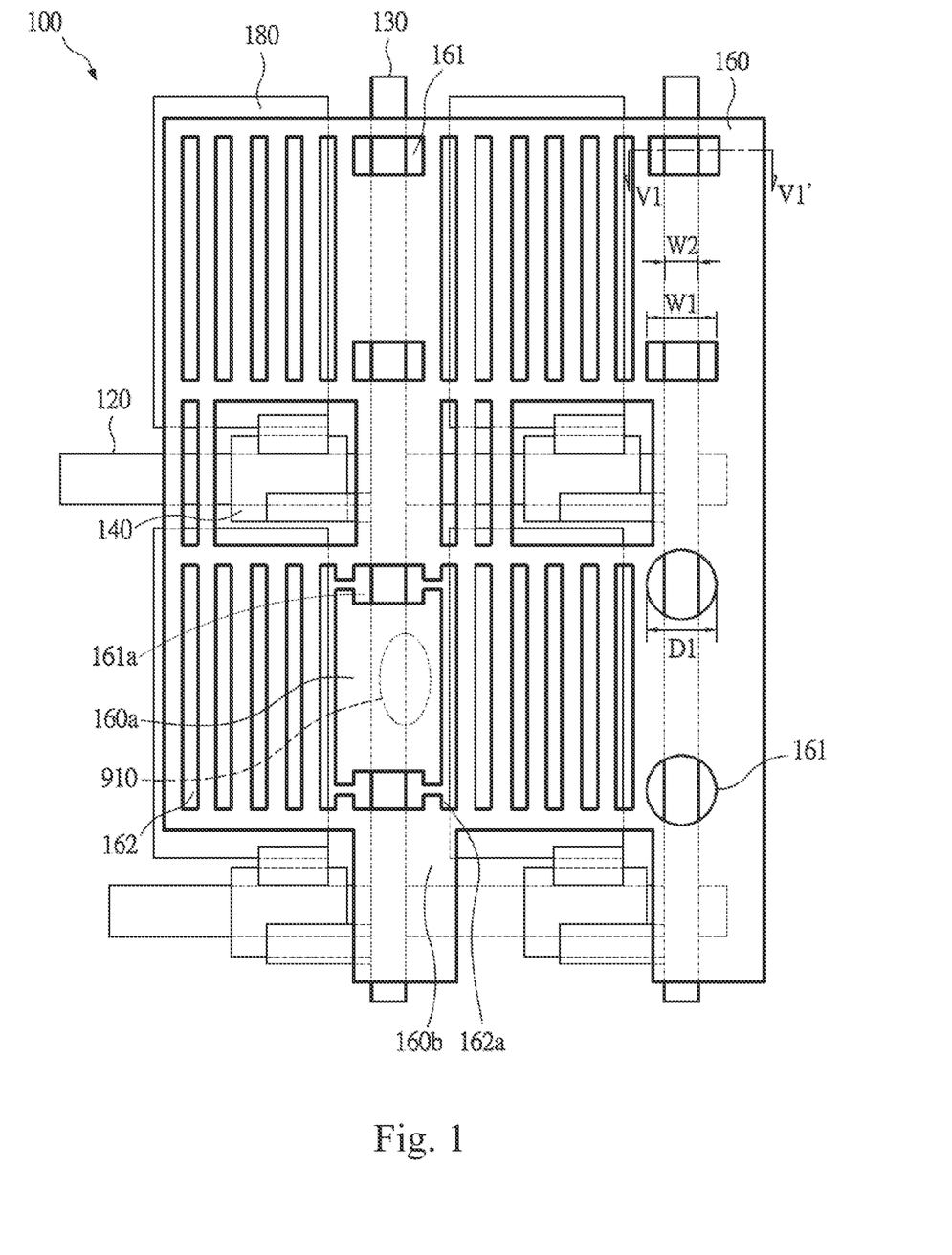
FIG. 1 is a schematic partial plane view of a TFT substrate according to a first embodiment of the present invention.
Figure 2:
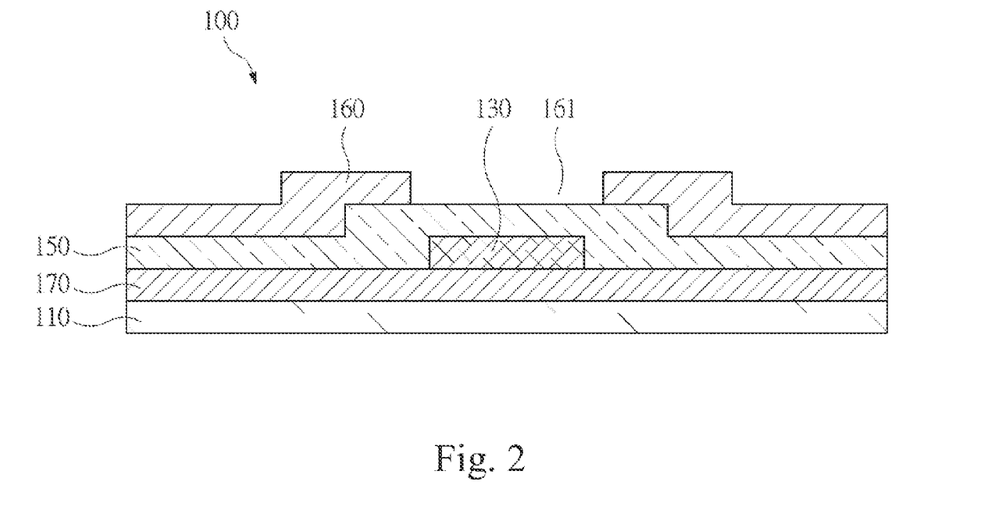
FIG. 2 is a schematic cross-sectional view taken along line V1-V1' FIG. 1.

FIG. 1 is a schematic partial plane view of a TFT substrate according to a first embodiment of the present invention. FIG. 2 is a schematic cross-sectional view taken along line V1-V1' of FIG. 1.

The thin film transistor (TFT) substrate 100 includes: a substrate 110, a plurality of scan lines 120, a plurality of data lines 130, a plurality of thin film transistors 140, a data line insulting layer 150, a common electrode 160, and a scan line insulting layer 170. The scan lines 120 are disposed on the substrate 110. The data lines 130 and the scan lines 120 are disposed across each other. The scan line insulting layer 170 is disposed between the scan lines 120 and the data lines 130, and located between the substrate 110 and the data lines 130. Each of the thin film transistors 140 is disposed at an intersection of each scan line 120 and each data line 130. In addition, the data line insulting layer 150 is disposed on a top surface of the scan line insulting layer 170, and used to cover the data lines 130. The common electrode 160 is disposed above the data line insulting layer 150, and includes a plurality of positioning through holes 161 which expose the data line insulting layer 150. The positioning through holes 161 are required to locate right above the data lines 130. Preferably, the top view of the positioning through holes 161 may be a rectangle shape, and the width W1 of the rectangle shape is larger than the width W2 of the data line 130. Alternatively, the top view of the positioning through holes 161 may be a circular shape, and the diameter Di of the circular shape is larger than the width W2 of the data lines 130.

A pixel area 180 is defined by every two adjacent scan lines 120 and every two adjacent data lines 130. Preferably, there are two positioning through holes 161 disposed between two adjacent pixel areas 180. The common electrode 160 further includes a plurality of bar-shaped through holes 162, and the bar-shaped through holes 162 are located above the pixel areas 180. The common electrode 160 is made of a transparent conductive material, for example, indium tin oxide (ITO).

During the formation process of the data line insulting layer 150 or the common electrode 160, particles 910 or photo-resists may be remained above the data line 130. When the common electrode 160 is pressed or the data line insulting layer 150 is cracked, the particles 910 may generate a short circuit between a part 160a of the common electrode 160 and the data line 130. At this time, the method of repairing TFT substrates of the present invention can be used. Firstly, a position of the particle 910 is determined (that is, the short circuit position of the common electrode 160 and the data line 130). Then, the part 160a of the common electrode near the particle 910 is electrically insulated, for example, the part 160a of the common electrode 160 which has a short circuit with the data line 130 is cut off, so that the part 160a and the other part 160b of the common electrode 160 are electrically insulated from each other.

Figure 3:
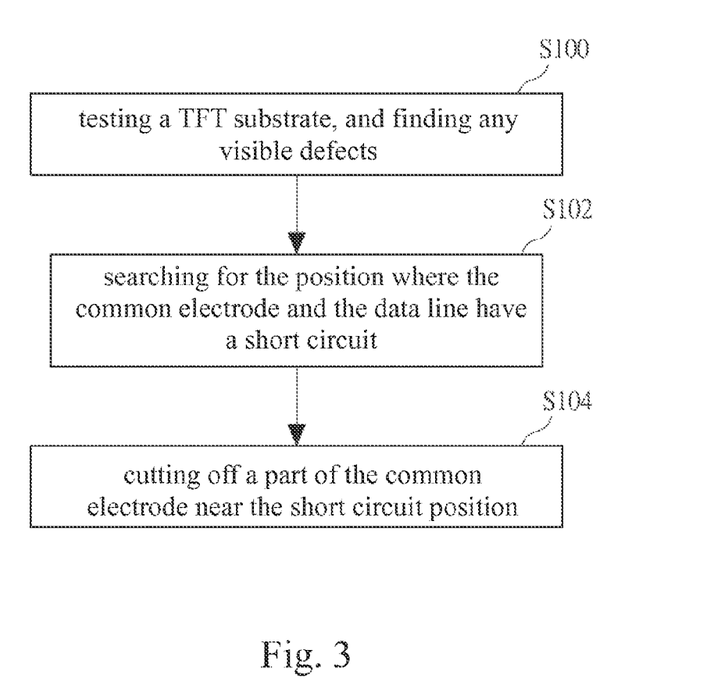
FIG. 3 is a flow chart showing the method of repairing a TFT substrate according to the present invention.

FIG. 3 is a flow chart showing the method of repairing a TFT substrate according to present invention, and the method includes the step as follows:

In step S100: testing a TFT substrate, and finding any visible defects. Please refer to FIGS. 1 and 2 together, when a TFT substrate 100 is produced, a test signal is sent to the data line 130 so as to find any visible defects, and predicting the area on the TFT substrate 100 where the data line 130 and the common electrode 160 may occur a short circuit problem.

In step S102: searching for the position where the common electrode 160 and the data line 130 have a short circuit. When any visible defects are searched, a microscope can be used to find the short-circuit position of the common electrode 160 and the data line 130.

In step S104: cutting off a part 160a of the common electrode 160 near the short circuit position. In this step, the top and bottom portions of the part 160a of the common electrode 160 is cut off, so that the part 160a of the common electrode and the other part 160b of the common electrode are electrically insulated from each other. Preferably, the positioning through holes 161 can be used as positioning points for cutting off the short circuit position of the common electrode 160. For example, a laser cutting process can be used to cut off the top and bottom portions of the part 160a of the common electrode 160 from the positioning through holes 161 to the bar-shaped through holes 162, such that parts of the bar-shaped through holes 162a can be communicated with parts of the positioning through holes 161a, and the part 160a of the common electrode 160 and the other part 160b of the common electrode 160 are electrically insulated from each other.

Figure 4:
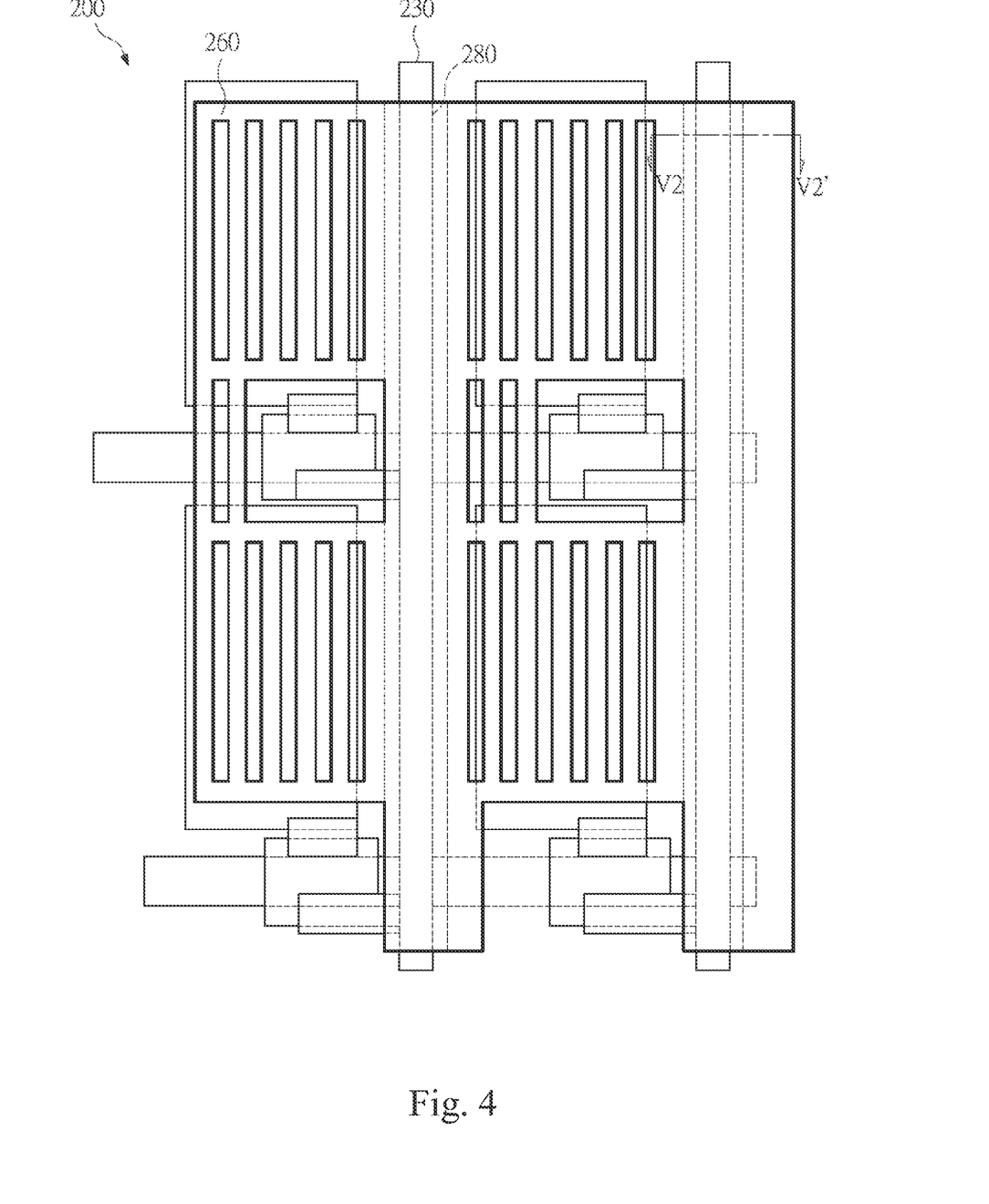
FIG. 4 is a schematic partial plane view of a TFT substrate according to a second embodiment of the present invention.
Figure 5:
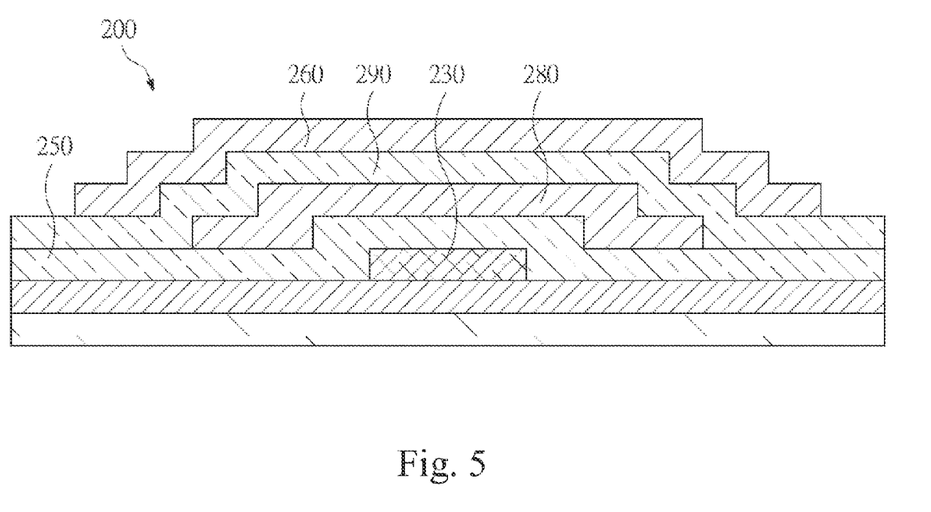
FIG. 5 is a schematic cross-sectional view taken along line V2-V2' of FIG. 4.

FIG. 4 is a schematic partial plane view of a TFT substrate 200 according to a second embodiment of the present invention. FIG. 5 is a schematic cross-sectional view taken along line V2-V2' of FIG. 4. The TFT substrate 200 of the second embodiment is similar to the TFT substrate 100 of the first embodiment, and the similar elements have been designated by similar reference numbers. The differences between the TFT substrate 200 of the second embodiment and the TFT substrate 100 of the first embodiment is that: the TFT substrate 200 of the second embodiment further includes a transparent conductive layer 280 and a transparent protective layer 290, but the common electrode 260 of the TFT substrate 200 doesn't have any positioning through hole. In addition, the transparent conductive layer 280 is disposed on a top surface of the data line insulting layer 250, the transparent protective layer 290 is disposed on a top surface of the transparent conductive layer 280, and the common electrode 260 is disposed on a top surface of the transparent protective layer 290, such that the transparent conductive layer 280 and the transparent protective layer 290 are located between the data line insulting layer 250 and the common electrode 260. The transparent conductive layer 280 and the transparent protective layer 290 can be used as a buffer layer to avoid a short circuit between the data line 230 and the common electrode 260 if particles fall above the data line 230. The transparent conductive layer 280 and the common electrode 260 may be made of the same material such as indium tin oxide (ITO). When the common electrode 260 is pressed or the data line insulting layer 250 is cracked, because of adding the transparent conductive layer 280 and the transparent protective layer 290, particles wouldn't cause a short circuit between the common electrode 260 and the data line 230, and the visible defects would less likely occur.

Figure 6:
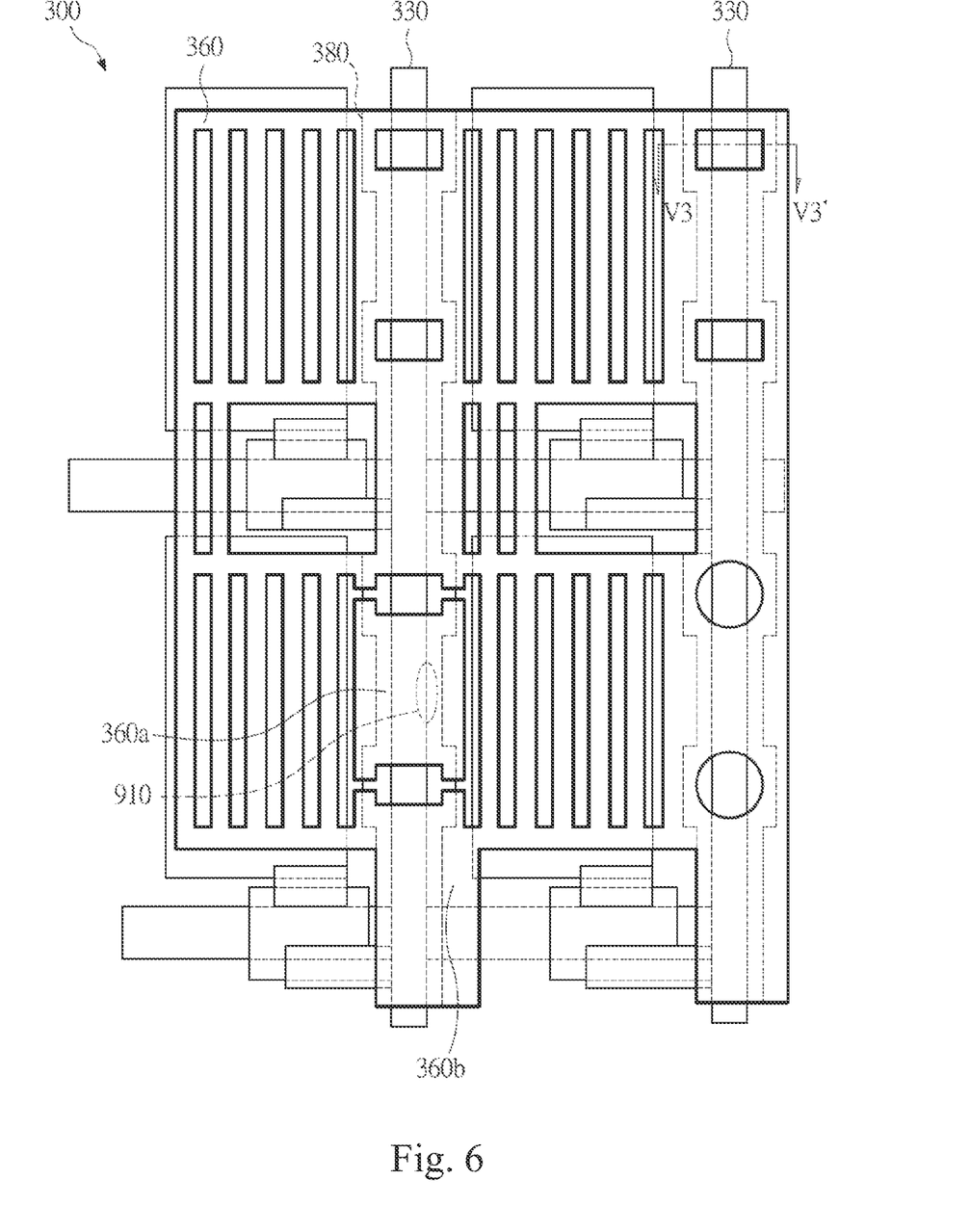
FIG. 6 is a schematic partial plane view of a TFT substrate according to a third embodiment of the present invention.
Figure 7:
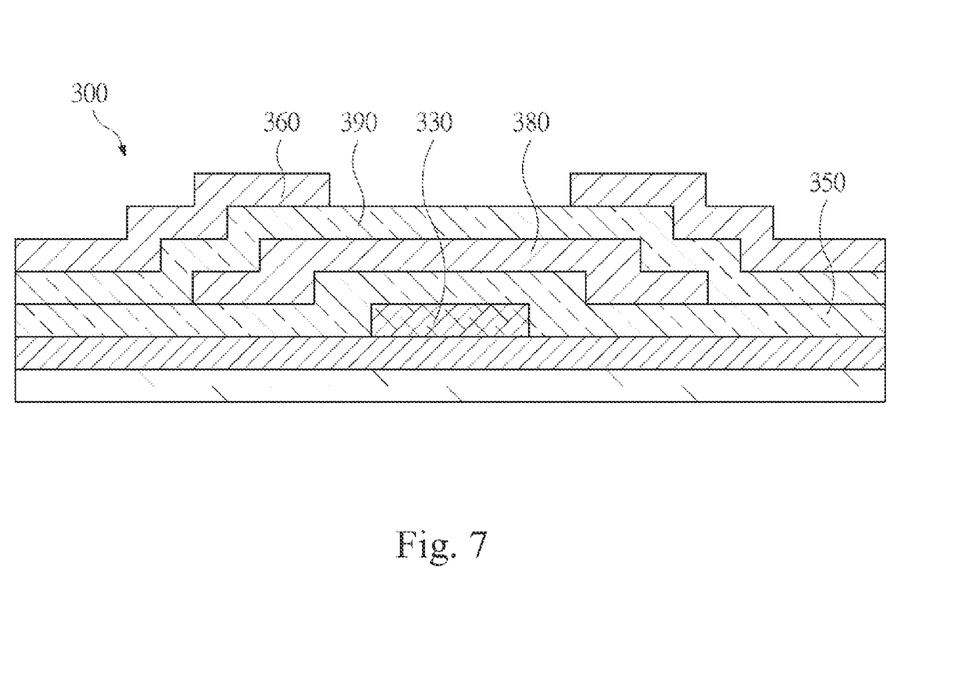
FIG. 7 is a schematic cross-sectional view taken along line V3-V3' of FIG. 6.

FIG. 6 is a schematic partial plane view of a TFT substrate according to a third embodiment of the present invention. FIG. 7 is a schematic cross-sectional view taken along line V3-V3' of FIG. 6. The TFT substrate 300 of the third embodiment is similar to the TFT substrate 100 of the first embodiment, and the similar elements have been designated by similar reference numbers. The differences between the TFT substrate 300 of the third embodiment and the TFT substrate 100 of the first embodiment is that: the TFT substrate 300 of the third embodiment further includes a transparent conductive layer 380 and a transparent protective layer 390. The transparent conductive layer 380 is disposed on a top surface of the data line insulting layer 350, the transparent protective layer 390 is disposed on a top surface of the transparent conductive layer 380, and the common electrode 360 is disposed on a top surface of the transparent protective layer 390, such that the transparent conductive layer 380 and the transparent protective layer 390 are located between the data line insulting layer 350 and the common electrode 360. The transparent conductive layer 380 and the common electrode 360 can be made of indium tin oxide (ITO). The transparent conductive layer 380 and the transparent protective layer 390 can be used as a buffer layer to avoid a short circuit between the data line 330 and the common electrode 360 if particles 910 fall above the data line 330. However, if the common electrode 360 is pressed or the data line insulting layer 350, the transparent conductive layer 380 and the transparent protective layer 390 are cracked due to a large size particle, the particle 910 causes a short circuit between a part 360a of the common electrode 360 and the data line 330. At this time, the method of repairing TFT substrates of the present invention can be used. Firstly, a position of a particle 910 is determined (that is, the short circuit position of the common electrode 360 and the data line 330). Then, the part 360a of the common electrode 360 near the particle 910 is electrically insulated, for example, the part 360a of the common electrode 360 which has a short circuit with the data line 330, so that the part 360a of the common electrode 360 and the other part 360b of the common electrode 360 are electrically insulated from each other.

To sum up, the TFT substrate of the present invention can be applied to the panels adopted the IPS (In Plane Switching) wide viewing angle technology and the panel adopted the FFS (Fringe Field Switching) technology. In the TFT substrate of the present invention, positioning through holes are used as positioning points for cutting off the short circuit position of the common electrode, and the top and bottom portions of the part of the common electrode where is near the short circuit position is cut off (for example, the top and bottom portions of the part of the common electrode cal be cut off form the positioning through holes to the bar-shaped through holes), such that the part of the common electrode and the other part of the common electrode are electrically insulated from each other, so as to repair the defect part. Alternatively, a transparent conductive layer and a transparent protective layer are used as a buffer layer to avoid a short circuit between the data line and the common electrode if particles fall above the data line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A thin film transistor (TFT) substrate, comprising:
a substrate;
a plurality of scan lines, disposed on the substrate;
a plurality of data lines, disposed across the scan lines;
a scan line insulting layer disposed between the scan lines and the data lines;
a plurality of thin film transistors, each of the thin film transistors disposed on an intersection of each scan line and each data line;
a data line insulting layer, disposed on a top surface of the scan line insulting layer and used to cover the data lines; and
a common electrode, disposed above the data line insulting layer, and comprising a plurality of positioning through holes, wherein the positioning through holes are located right above the data lines, a top view of the positioning through hole is a rectangle shape, and a width of the positioning through hole is larger than a width of the data line.

2. The TFT substrate as claimed in claim 1, wherein a pixel area is defined by every two adjacent scan lines and every two adjacent data lines, and there are two positioning through holes disposed between two adjacent pixel areas.

3. The TFT substrate as claimed in claim 1, further comprises a transparent conductive layer and a transparent protective layer, wherein the transparent conductive layer is disposed on a top surface of the data line insulting layer, and the transparent protective layer is disposed on a top surface of the transparent conductive layer, such that the transparent conductive layer and the transparent protective layer are located between the data line insulting layer and the common electrode.

4. The TFT substrate as claimed in claim 3, wherein the common electrode further comprises a plurality of bar-shaped through holes, wherein the bar-shaped through holes are located above the pixel area, parts of the bar-shaped through holes are communicated with parts of the positioning through holes, and a part of the common electrode and the other part of the common electrode are electrically insulated from each other.

5. The TFT substrate as claimed in claim 1, wherein the positioning through holes expose the data line insulting layer.

6. A method of repairing a thin film transistor (TFT) substrate, comprising the following steps of:
providing a TFT substrate as claimed in claim 1;
testing the TFT substrate, and finding visible defects;
searching for a short circuit position where the common electrode and the data line have a short circuit; and
cutting off a part of the common electrode near the short circuit position, wherein the positioning through holes are used as positioning points for cutting off the short circuit position of the common electrode.

7. The method of repairing a TFT substrate as claimed in claim 6, wherein the common electrode further comprises a plurality of bar-shaped through holes, and the bar-shaped through holes are located above the pixel area, and comprises using a laser cutting process to cut off top and bottom portions of the part of the common electrode from the positioning through holes to the bar-shaped through holes.

8. The method of repairing a TFT substrate as claimed in claim 6, wherein a pixel area is defined by every two adjacent scan lines and every two adjacent data lines, and there are two positioning through holes disposed between two adjacent pixel areas.

9. The method of repairing a TFT substrate as claimed in claim 6, wherein a top view of the positioning through hole is a rectangle shape, and a width of the positioning through hole is larger than a width of the data line.

10. The method of repairing a TFT substrate as claimed in claim 6, wherein a top view of the positioning through hole is a circular shape, and the diameter of the positioning through hole is larger than a width of the data line.

11. The method of repairing a TFT substrate as claimed in claim 6, further comprises a transparent conductive layer and a transparent protective layer, wherein the transparent conductive layer is disposed on a top surface of the data line insulting layer, and the transparent protective layer is disposed on a top surface of the transparent conductive layer, such that the transparent conductive layer and the transparent protective layer are located between the data line insulting layer and the common electrode.

12. A thin film transistor (TFT) substrate, comprising:
a substrate;
a plurality of scan lines, disposed on the substrate;
a plurality of data lines, disposed across the scan lines;
a scan line insulting layer disposed between the scan lines and the data lines;
a plurality of thin film transistors, each of the thin film transistors disposed on an intersection of each scan line and each data line;
a data line insulting layer, disposed on a top surface of the scan line insulting layer and used to cover the data lines; and
a common electrode, disposed above the data line insulting layer, and comprising a plurality of positioning through holes, wherein the positioning through holes are located right above the data lines, a top view of the positioning through hole is a circular shape, and the diameter of the positioning through hole is larger than a width of the data line.

13. A thin film transistor (TFT) substrate, comprising:
a substrate;
a plurality of scan lines, disposed on the substrate;
a plurality of data lines, disposed across the scan lines;
a scan line insulting layer disposed between the scan lines and the data lines;
a plurality of thin film transistors, each of thin film transistors disposed on an intersection of each scan line and each data line;
a data line insulting layer, disposed on a top surface of the scan line insulting layer and used to cover the data lines; and
a common electrode, disposed above the data line insulting layer, and comprising a plurality of positioning through holes, wherein the positioning through holes are located right above the data lines,
wherein the common electrode further comprises a plurality of bar-shaped through holes, wherein the bar-shaped through holes are located above the pixel area, parts of the bar-shaped through holes are communicated with parts of the positioning through holes, and a part of the common electrode and the other part of the common electrode are electrically insulated from each other.

* * * * *